United States Patent
Liu et al.

(10) Patent No.: US 8,367,481 B2
(45) Date of Patent: Feb. 5, 2013

(54) FOUR MOSFET FULL BRIDGE MODULE

(75) Inventors: Yong Liu, Scarborough, ME (US); Qiuxiao Qian, Suzhou (CN); JiangYuan Zhang, Suzhou (CN); Mike Speed, Santa Clara, CA (US); JungTae Lee, Bucheon-si (KR); Luke Huiyong Chung, Boradong (KR)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 13/397,285

(22) Filed: Feb. 15, 2012

(65) Prior Publication Data

US 2012/0149149 A1 Jun. 14, 2012
US 2013/0005083 A9 Jan. 3, 2013

Related U.S. Application Data

(60) Division of application No. 12/128,130, filed on May 28, 2008, now Pat. No. 8,138,585, and a continuation-in-part of application No. 12/046,734, filed on Mar. 12, 2008, now Pat. No. 7,915,721.

(51) Int. Cl.
*H01L 21/56* (2006.01)

(52) U.S. Cl. . 438/124; 257/675; 257/796; 257/E21.502; 257/E23.061; 438/122; 438/123

(58) Field of Classification Search ........................ None
See application file for complete search history.

(56) References Cited

U.S. PATENT DOCUMENTS

| | | | |
|---|---|---|---|
| 6,363,016 B1 | 3/2002 | Lin et al. | |
| 7,768,108 B2 | 8/2010 | Liu et al. | |
| 7,915,721 B2 * | 3/2011 | Liu et al. | 257/678 |
| 2005/0024805 A1 | 2/2005 | Heilbronner et al. | |
| 2005/0206010 A1 | 9/2005 | Noquil | |
| 2006/0055027 A1 | 3/2006 | Kitabatake et al. | |
| 2007/0114352 A1 | 5/2007 | Cruz et al. | |
| 2007/0132073 A1 | 6/2007 | Tiong et al. | |
| 2009/0230518 A1 * | 9/2009 | Liu et al. | 257/666 |

FOREIGN PATENT DOCUMENTS

WO WO00-01060 A1 1/2000

OTHER PUBLICATIONS

Fairchild Semiconductor Corporation, "Application Note AN4143, LCD Backlight Inverter Drive IC (FAN7310)", also found at http://www.fairchildsemi.com Rev.1.0.0, Copyright 2005, Fairchild, pp. 1-14.
Fairchild Semiconductor Corporation, "FAN7310, LCD Backlight Interver Drive Integrated Circuit", also found at http://www.fairchildsemi.com Rev.1.0.3, Copyright 2005, Fairchild, pp. 1-11.
Kipo (ISA/KR), International Search Report from corresponding PCT Application No. PCT/US2009/045255, as completed Jan. 7, 2010, total 2 pages.

* cited by examiner

*Primary Examiner* — Calvin Lee
*Assistant Examiner* — Abul Kalam
(74) *Attorney, Agent, or Firm* — Hiscock & Barclay, LLP

(57) ABSTRACT

A molded, leadless packaged semiconductor multichip module includes 100 has four mosfets 10, 12, 14, 16 for a full bridge circuit. The mosfets may include two N-channel and two P-channel devices or four mosfets of the same type, but four N-channel are preferred. In module 100 there are two leadframes 30, 40 for assembling the mosfets. In particular, the two N-channel and two P-channel devices are disposed between two leadframes and encapsulated in an electrically insulating molding compound 84. The resulting package has four upper heat sinks 44.1-44.4 that are exposed in the molding compound 84 for transferring heat from the mosfets to the ambient environment. No wire bonds are required. This can significantly reduce the on resistance, $RDS_{ON}$. The top or source-drain lead frame 30 may be soldered to the sources and gates of the bridge mosfets.

8 Claims, 22 Drawing Sheets

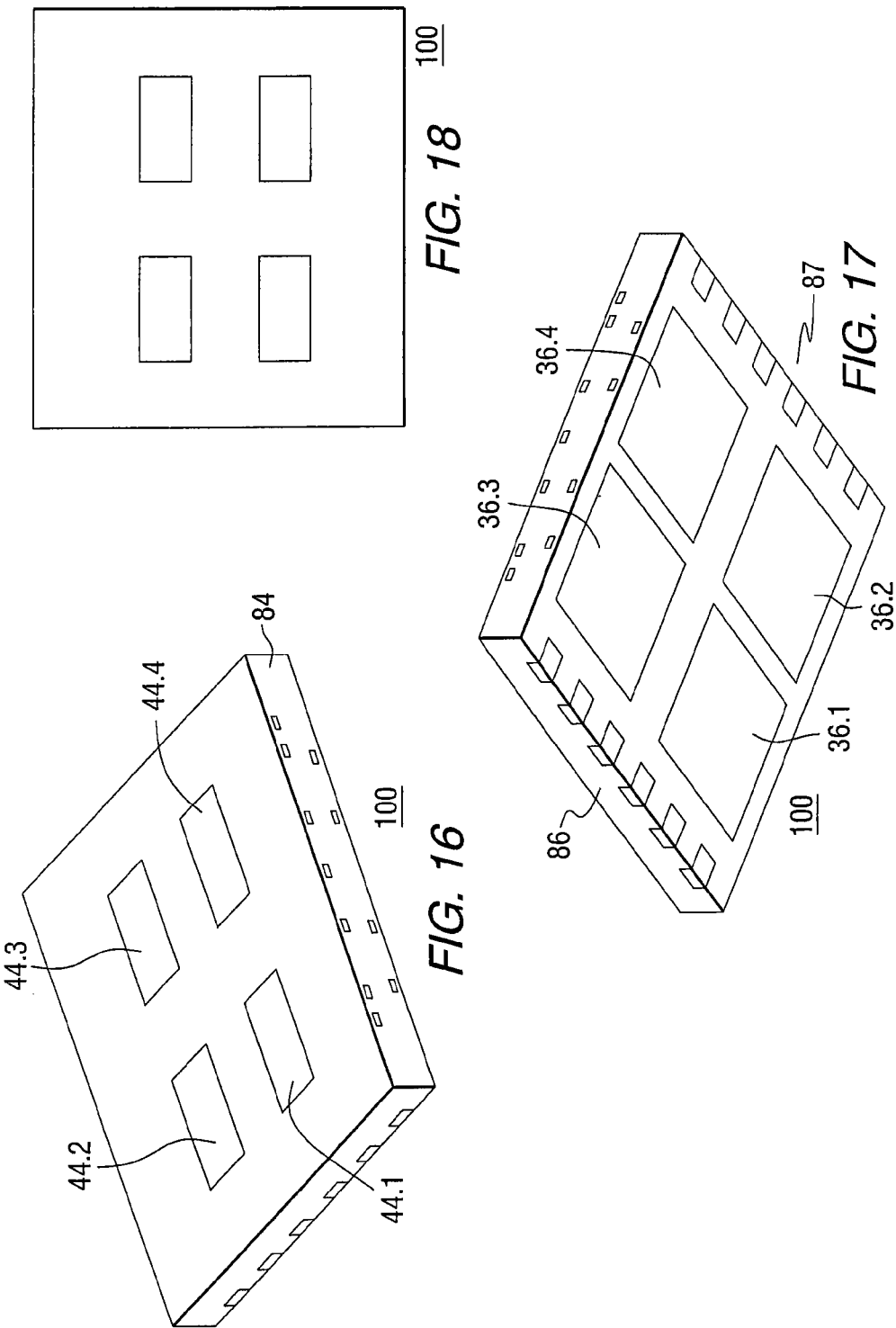

FOUR MOSFET FULL BRIDGE MODULE

CROSS-REFERENCE TO RELATED APPLICATIONS

This application is a continuation in part application of earlier filed U.S. patent application Ser. No. 12/046,734 filed Mar. 12, 2008, now U.S. Pat. No. 7,915,721 and is a divisional application of U.S. patent application Ser. No. 12/128,130 filed May 28, 2008, now U.S. Pat. No. 8,138,585, the specification of which is hereby incorporated in its entirety.

BACKGROUND OF THE INVENTION

Many devices, such as motors, amplifiers, and the back lights that power liquid crystal displays are supplied power through an arrangement of four mosfets. The arrangement is generally known as a full bridge or an H-bridge. A control circuit for the full bridge will include an oscillator and pulse width modulator for generating gate control signals. The outputs of the control circuit are coupled to gate drivers to boost the voltage of the gate control signal to a level acceptable to the mosfets. The gate drivers may also provide isolation of the mosfets from noise generated by the oscillator in the control circuit.

The control circuit and the gate drivers may themselves be integrated into a single circuit and packaged in one or more small size packages, such as a molded leadless package. Such packages consume a small area and a small volume. However, each mosfet is as large as or larger in size than the control circuit. The mosfets can be individually packaged and wired to the control circuit on the printed circuit board of the controlled system. However, four separate mosfets consume a lot of area and volume. As systems shrink, the amount of area and volume for control and mosfet packages is also reduced.

In order to address the problem of fitting more devices into ever-smaller spaces and improving the thermal and electrical performance of packaged devices, those skilled in the art have packaged four mosfets together in a single package. A typical full bridge mosfet package has two high side mosfets and two low side mosfets. The four mosfets are arranged in a linear array, one next to the other. A typical four-mosfet package is 29×13×3.15 mm, has twenty pins including ten on each of the 29 mm sides, and the package configuration is known as a thin shrink small outline package (TSSOP) or a small outline integrated circuit SOIC). See FIG. 2. The package has several disadvantages. It is not only large but also has poor thermal/electrical performance and is expensive in its materials, including its lead frame and encapsulating material.

BRIEF SUMMARY OF THE INVENTION

A molded, leadless packaged semiconductor multichip module includes four mosfets for a full bridge circuit. The mosfets may include two N-channel and two P-channel devices or four mosfets of the same type, but four N-channel are preferred. At least six examples of bridge modules are included. The modules have a smaller footprint (area) than the prior art TSSOP package and a smaller volume.

In some examples, the package has two leadframes for assembling the mosfets. In particular, the two N-channel and two P-channel devices are disposed between two leadframes and encapsulated in an electrically insulating molding compound. The resulting package has four upper heat sinks that are exposed in the compound for transferring heat from the mosfets to the ambient environment. No wire bonds are required. This can significantly reduce the on resistance, $RDS_{ON}$. The top or source-drain lead frame may be soldered to the sources and gates of the bridge mosfets. An alternate connection technique uses conductive tape on the sources for attaching the lead frame to the sources and wire bonding for connecting the gates to leadless contacts.

Examples of four same type mosfets include leadframes with two levels interconnected by an integral body portion for connecting a source of one mosfet to a drain of another mosfet. Two such assemblies are included in the full bridge module. Ribbon bonds, wire bonds and clip type bonds connect the sources and gates to leadless contact pads.

BRIEF DESCRIPTION OF THE DRAWINGS

FIGS. 16-18 show external views of embodiment of the module of the first example.

DETAILED DESCRIPTION OF THE INVENTION

Figure 1:
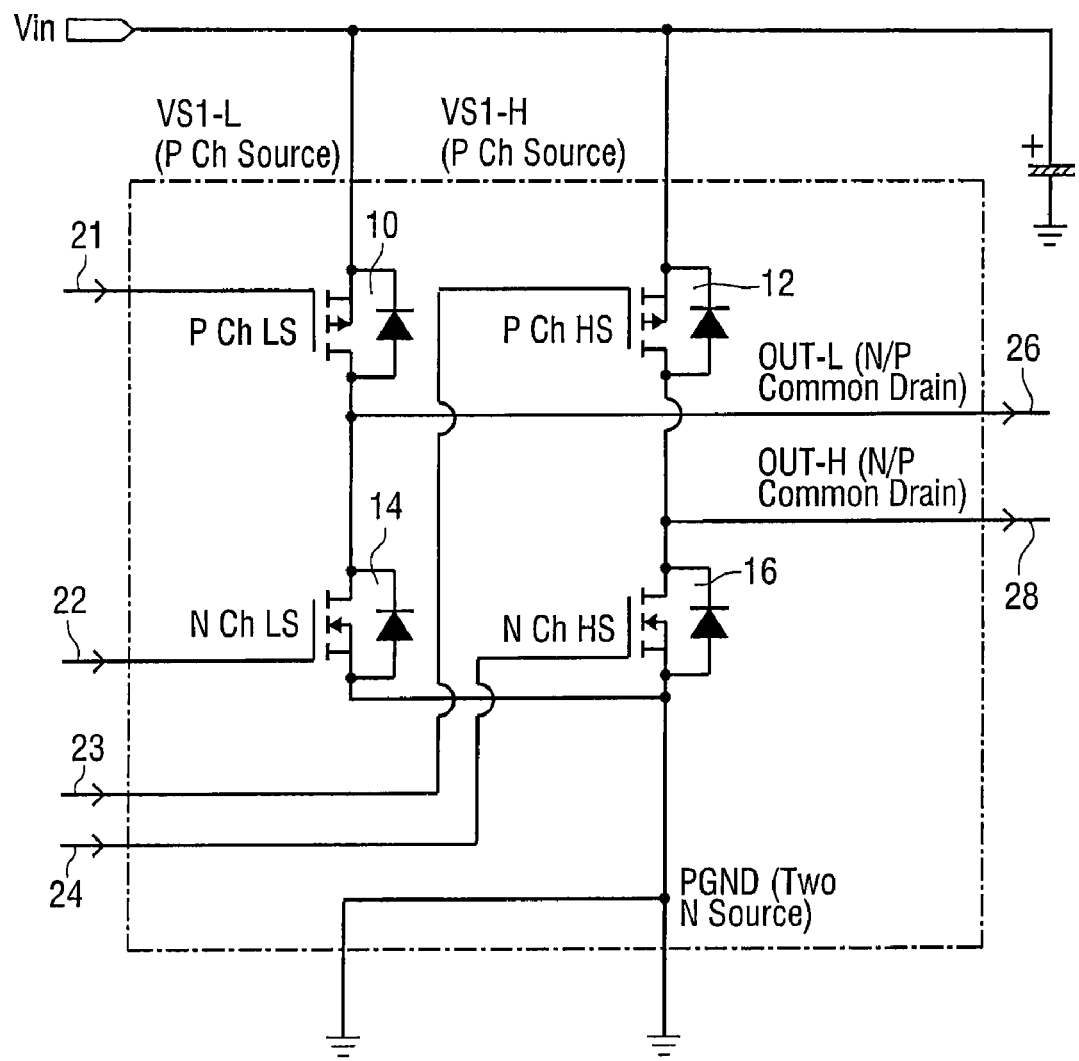
FIG. 1 is a circuit schematic of the first example of a four MOSFET circuit.

Turning to FIG. 1, there is shown an electrical schematic for a two-by-two arrangement of mosfets 10, 12, 14, and 16 disposed inside the module 100. The example shown in FIG. 1 has two P-channel mosfets 10, 12 and two N-channel mosfets 14, 16. However, those skilled in the art understand that a full bridge may be made with four N-channel or four P-channel mosfets. Examples of such bridges are included below. The P-channel mosfet 10 and the N-channel mosfet 14 are the low side of the bridge. The P-channel mosfet 12 and the N-channel mosfet 16 are the high side of the bridge. The drains of the low side mosfets are common as are the drains of the high side mosfets. Input signals 21-24 from gate drivers (not shown) are connected to the leadless gate contacts. The sources of the P-channel mosfets 10, 12 are connected to leadless contacts that are in turn connected to a voltage source, $V_{IN}$. The sources of the N-channel mosfets 14, 16 are connected to ground. Output lines 26 and 28 are connected to leadless contacts for powering the back lights of a display (not shown). The operation of the bridge circuit is conventional.

The mosfets 10, 12, 14, 16 are mounted between two lead frames, 30, 40 shown in detail in FIGS. 3-6. The following description will refer to the 'top' surface of each lead frame as the surface that makes contact to the mosfet. The 'bottom' surface is the surface that is exposed, at least in part, in the molding compound 84. Drain lead frame 30 has two, spaced apart rectangular members 37, 39. The members 37, 39 receive the drains of the mosfets on top surface 31 to provide the drain-to-drain connections between the low side mosfets 10, 14 and the high side mosfets 12, 16 and no external connections or internal wire bonds are needed. Surface 31 surface has four die attach pads 32.1-32.4 for holding the dies in place and for making electrical contact to the drains of the mosfets. The bottom surface 38 of the drain lead frame 30 has raised heat sinks 36.1-36.4 that are at least partially exposed in the encapsulating molding material 84. Openings 33.1-33.4 in the members 37, 39 and the space between the members permit molten encapsulating fluid to flow freely in the mold cavity between the opposite sides of the lead frame 30 and thus prevent voids from forming inside the package. Severed tie bars 34.1-34.4 and 35.1-35.4 connect the lead frame 30 to rails 51.1, 51.2 of the lead frame 50. See FIG. 9.

Figure 7:
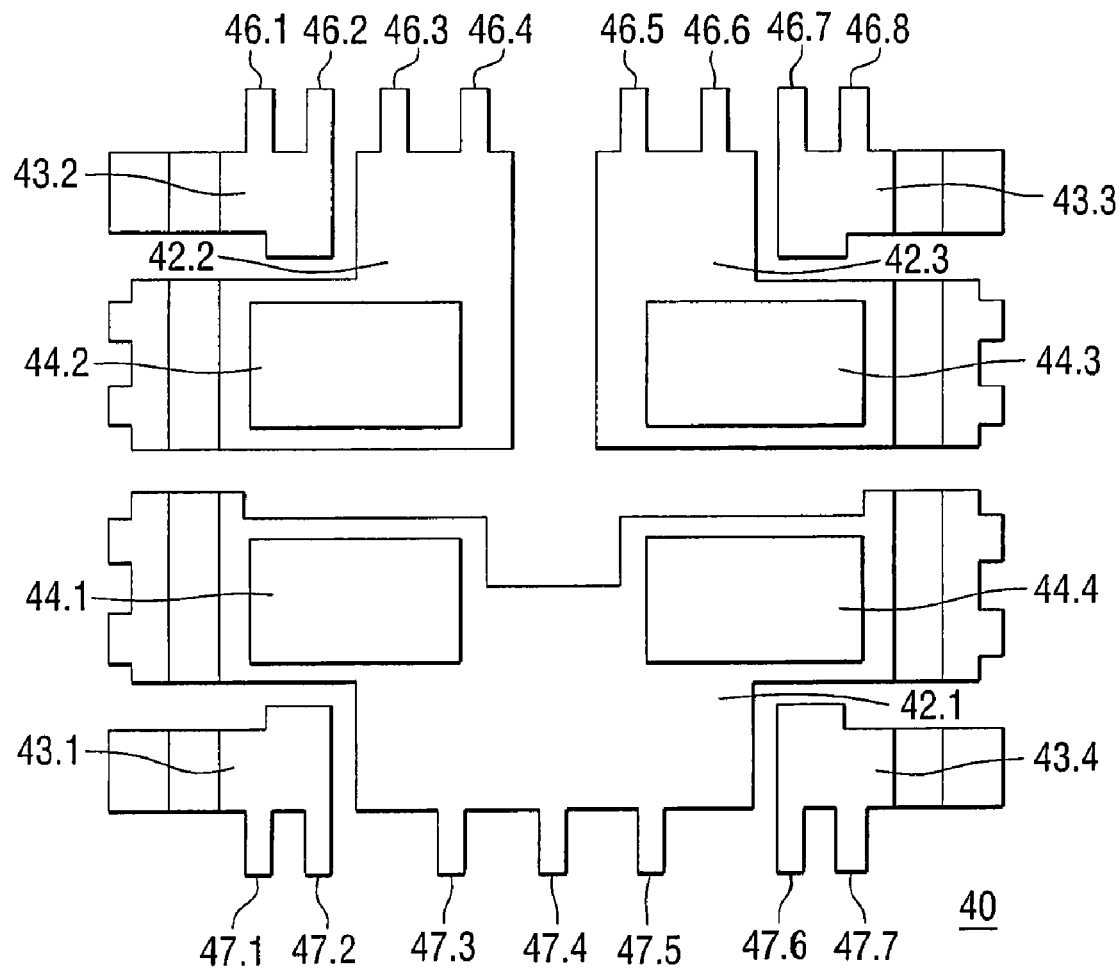
FIG. 7 is an enlarged plan view of the source-gate lead frame of the first example.
Figure 8:
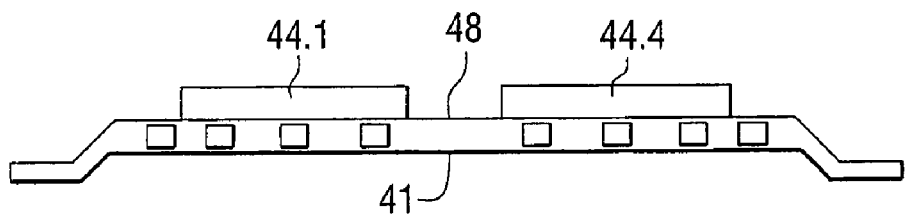
FIG. 8 is an end view of the source-gate lead frame of the first example.

Source-gate lead frame 40 has three source contact lead frame members 42.1-42.3. See FIGS. 5 and 7. Source lead frame member 42.1 is large enough to contact two sources and provides the common ground connection for the N-channel mosfets 14, 16. Source lead frame members 42.2 and 42.3 contact the sources of the P-channel mosfets 10, 12. The members 42.1-42.3 are spaced apart permit molten encapsulating fluid to flow freely in the mold cavity between the opposite sides of the lead frame 40 and thus prevent voids from forming inside the package. The members are terminated at one end in leadless contacts and an intermediate portion sloped toward the source contact regions. Surface 48 (FIG. 8) has four heat sinks, including two heat sinks 44.1, 44.4 on member 42.1 and one each 42.2, 42.3 on members 41.2 and 41.3. The source-gate contact pads 43.1-43.4 have leadless contacts at one end, and an intermediate, sloped portion that terminates in a contact pad.

Figure 9:
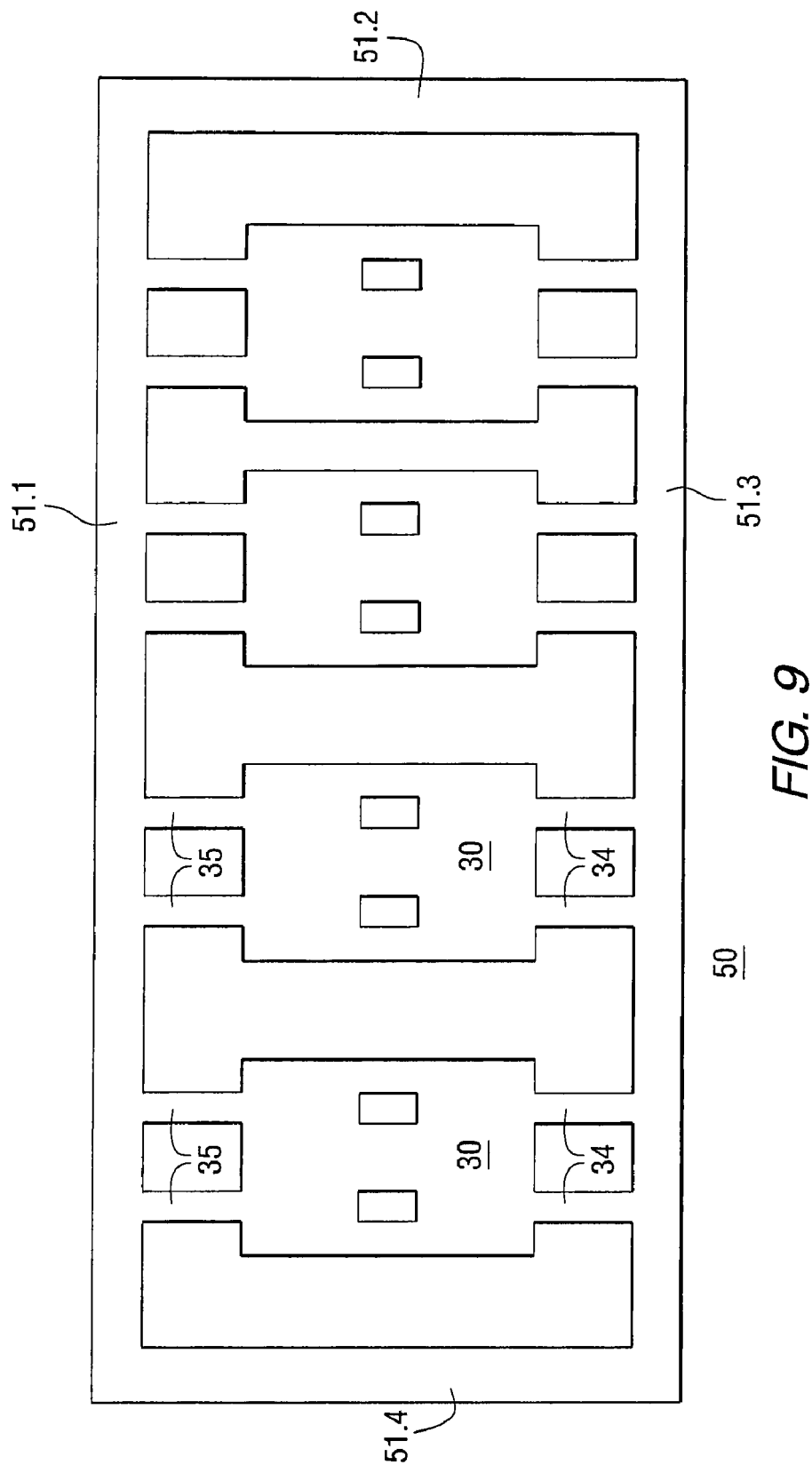
FIG. 9 is an example of a matrix holding a plurality of drain leadframes for the first example.

FIG. 9 shows a typical drain lead frame matrix 50 with a plurality of individual drain lead frames 30. Tie bars 34, 35 connect the lead frames 30 to opposite rails 51.1 and 51.2. The matrix 50 begins as a sheet of conductive metal, typically copper, that is coated or clad with one or more layers of nickel, palladium, gold, silver, lead, tin, other conductive metals and alloys. In a machining operation, the unwanted portions of metal are removed, typically by a stamping die configured to remove the unwanted metal portions from the metal sheet. A conductive epoxy or a thermal grease holds the heat sinks 36 on the surface 38. As an alternative, the metal sheet may be forged to flatten selected areas and thereby create raised heat sinks 36 on surface 38.

Figure 10:
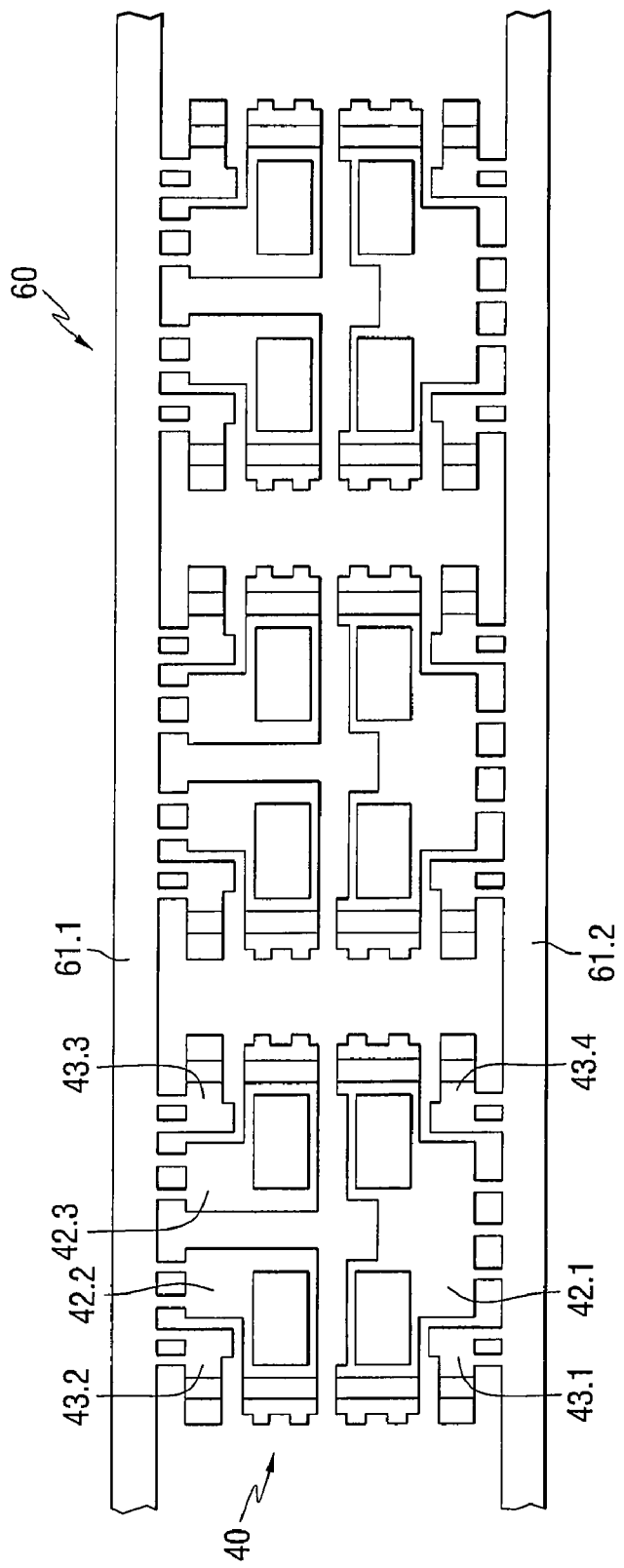
FIG. 10 is a matrix of a plurality of source and gate leadframes for the first example.
Figure 11:
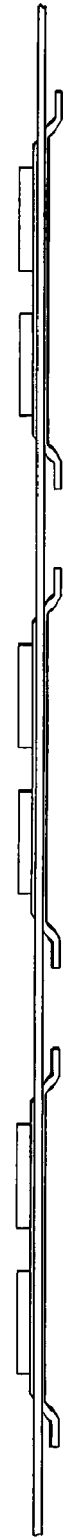
FIG. 11 is an edge view of FIG. 10.

FIG. 10 shows a typical source-gate lead frame matrix 60 with a plurality of individual lead frames 40. Tie bars 46.1-46.8 and 47.1-47.8 (FIG. 7) connect the lead frames 40 to opposite rails 61.1 and 61.2. The matrix 60 begins as a sheet of conductive metal, typically copper, that is coated or clad with one or more layers of nickel, palladium, gold, silver, lead, tin, other conductive metals and alloys. In a first machining operation, the unwanted portions of metal are removed, typically by a stamping die configured to remove the unwanted metal portions from the metal sheet. After removal, the ends of the gate and source members are bent at an angle of 45 degrees so that the leadless contact ends of the gate and source members are in a plane parallel but spaced from the plane that includes the contacts to the sources and gates. See FIG. 11. A conductive epoxy or a thermal grease holds the heat sinks 44 on the surface 48. As an alternative, the metal sheet may be forged to flatten selected areas and thereby create raised heat sinks 44 on surface 48.

Figure 2:
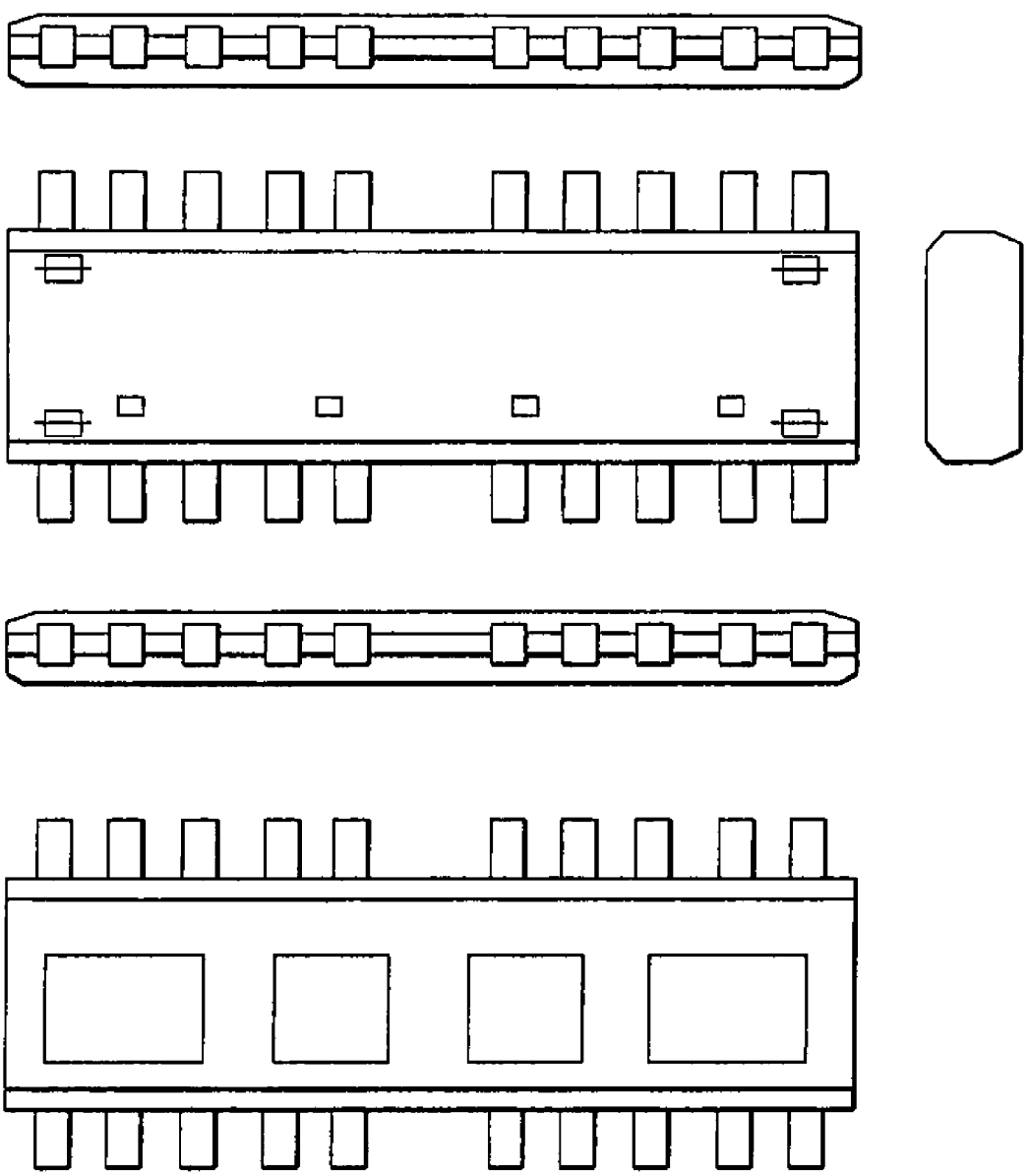
FIG. 2 is a prior art TSSOP package.
Figure 3:
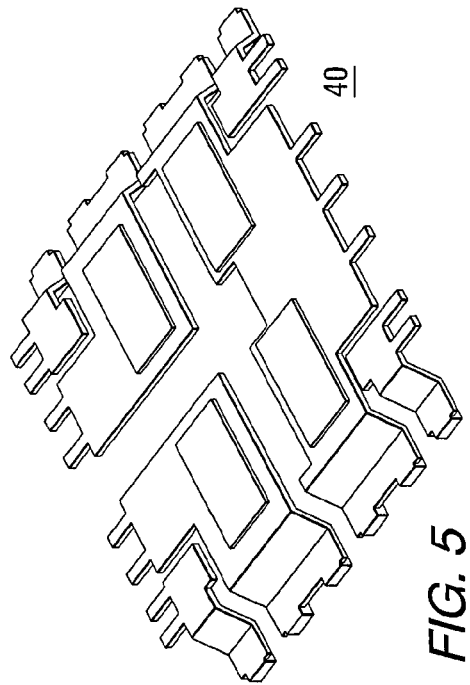
FIGS. 3 and 4 are top and bottom views of a drain leadframe for the first example.
Figure 4:
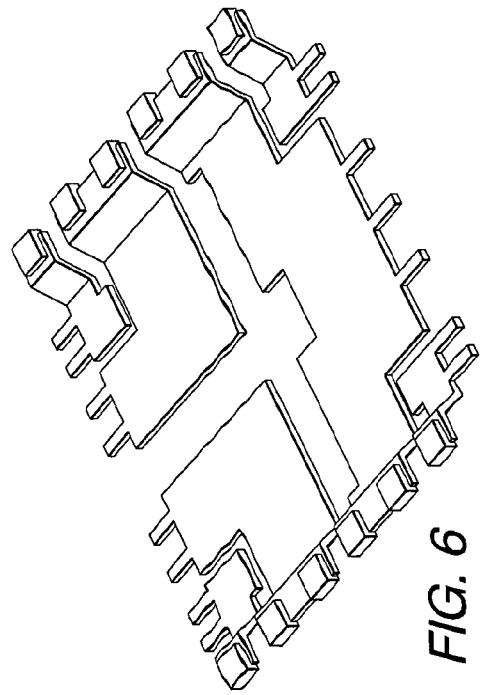
Figure 5:
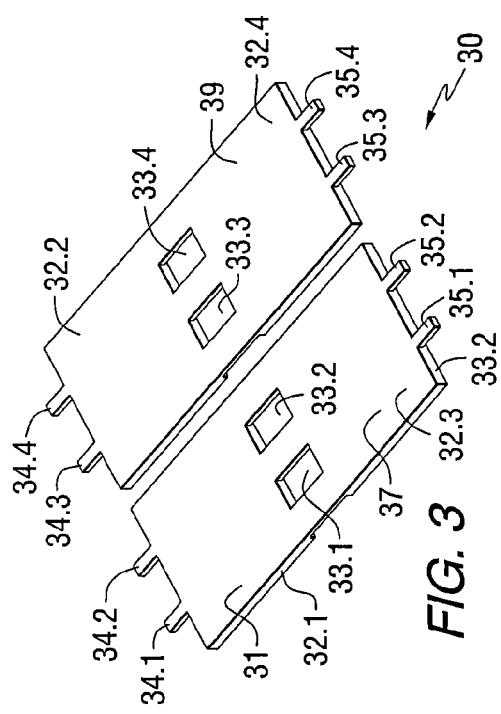
FIGS. 5 and 6 are top and bottom views of the second or source-gate lead frame for the package of the first example.
Figure 6:
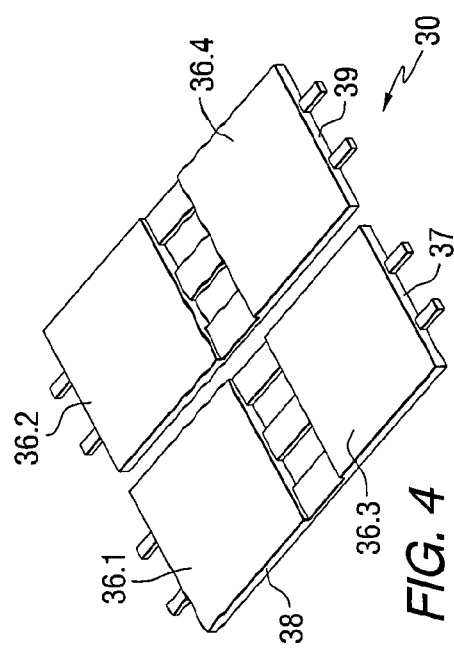
Figure 12:
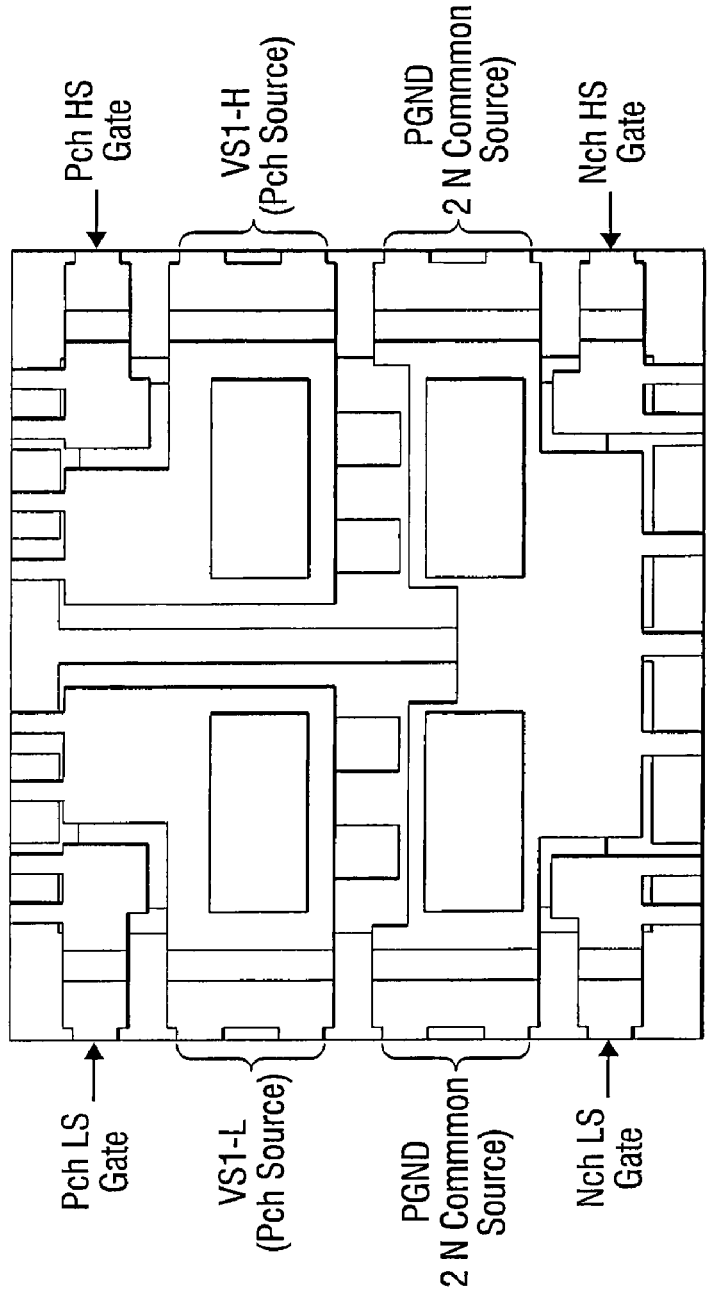
FIG. 12 shows a plan view of an assembled set of four MOSFETs with drain and source gate leadframes.
Figure 14:
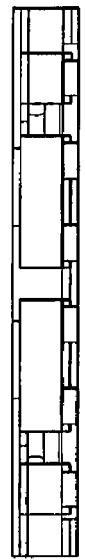
FIG. 14 is another end view of the assembly of step 76 in FIG. 15.
Figure 13:
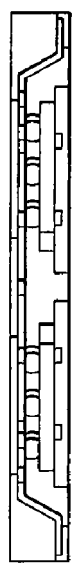
FIG. 13 is one end view of the assembly of step 76 in FIG. 15.

As shown in FIGS. 12, 13 and 14 a full bridge 100 of four packaged mosfets is a smaller package than the prior art of FIG. 2. The multichip module 100 is 7×7×0.8 mm. Its area is seven times smaller than the prior art TSSOP package and its volume is twenty-seven times smaller than the volume of the TSSOP package. The surface area of the module 100 is only fourteen percent of the surface area of the prior art TSSOP package. The multichip module has four mosfets (not shown) arranged in a two by two array, in contrast to the linear arrangement of four mosfets in the prior art package. The multichip module 100 has a array of four heat sinks 44.1-44.4 that are attached to the sources of the mosfets for carrying heat away from the package. See the top view of the module 100 in FIG. 16. The heat sinks 44.1-44.4 have their upper surfaces exposed in the electrical insulating encapsulation material 84. Turning to the lower surface view in FIG. 17, the source and gate leadless contacts for the four mosfets are arranged in two rows 86, 87 along opposite lower edges of the module 100. The module 100 has only twelve leadless contacts, compared to the twenty leads required by the prior art package. The lower surface has four drain contacts 36.1-36.4 exposed in the encapsulating material 84. The drain contacts do not require leadless contacts on the edges. Thus, the wiring of the module to a printed circuit board is easier because the module 100 requires fewer traces (16 compared to the 20 of the TSSOP).

Figure 15:
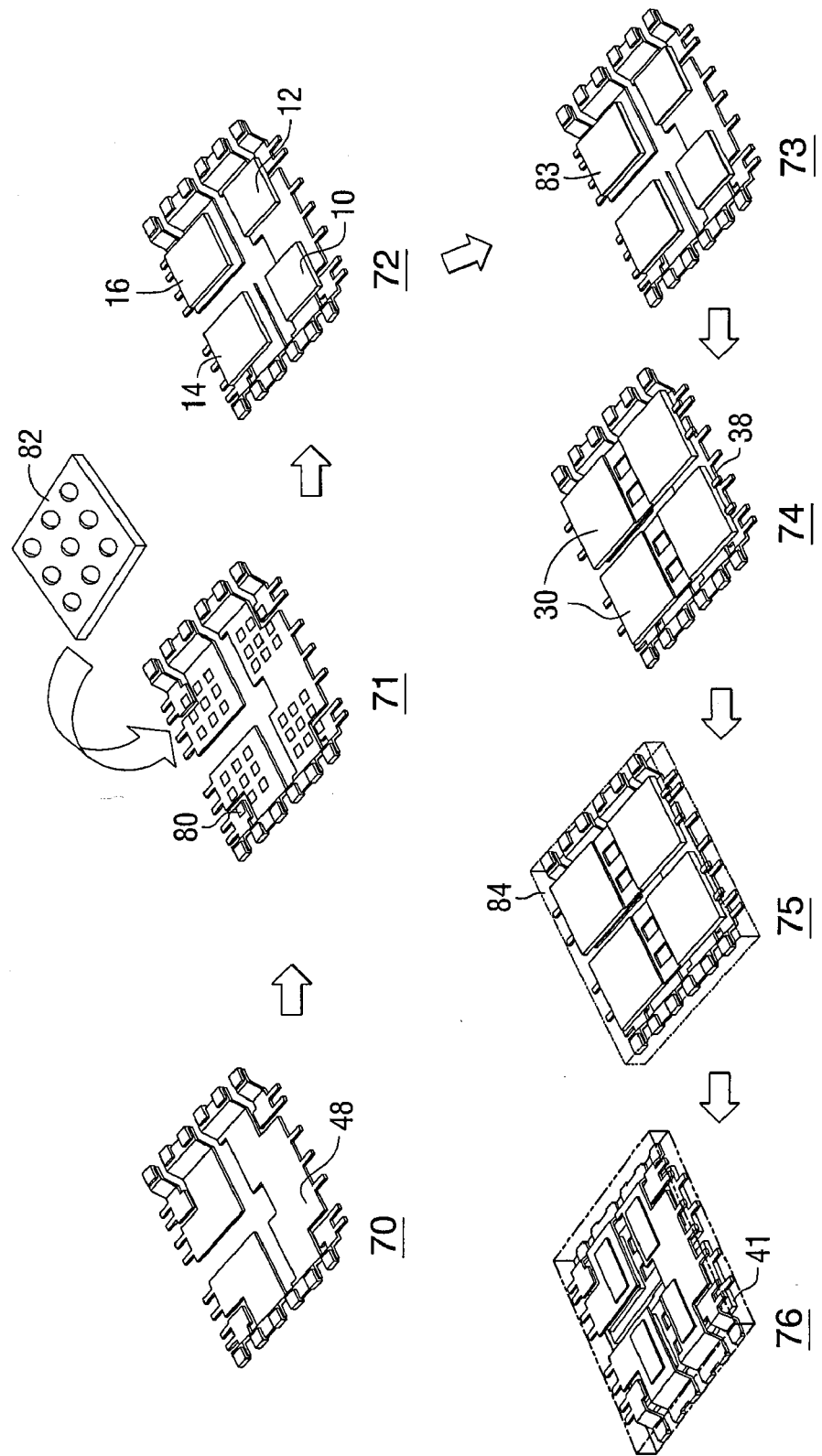
FIG. 15 shows a set of steps that includes the assembly and encapsulation of a 4 MOSFET package of the first example.
Figure 21:
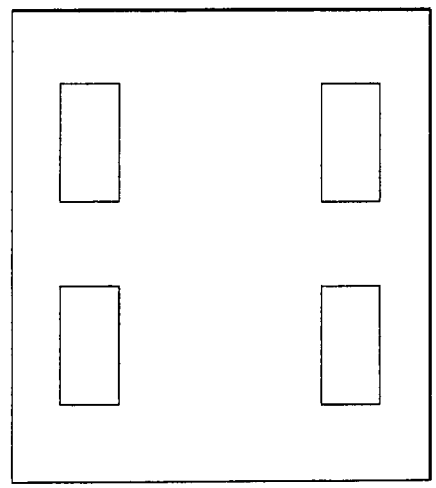
FIGS. 19-22 show external views of a second example.
Figure 22:
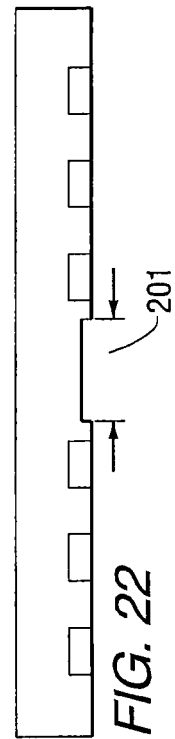
Figure 19:
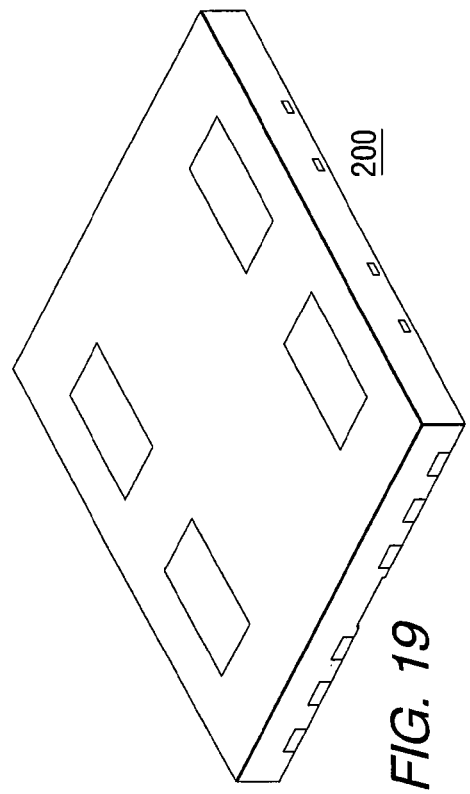

A process for manufacturing a multichip module 100 is shown in FIG. 15. In a first step 70, a source-gate lead frame 40 is arranged so that surface 48 faces up. Next, in step 71 a screen printing operation deposits soft solder 80 on the upturned surface 48. Mosfets 10, 12, 14, 16 are manufactured to have ball grid array contacts to their respective sources and gates. In step 72 the mosfets are flip chip attached to the surface 48. A conductive adhesive holds them in place while a reflow operation melts the soft solder to secure the mosfets to the surface 48. The N-channel mosfet sources are secured to member 42.1 and the P-channel mosfet sources are secured to members 42.2 and 42.3. The gates of the N-channel mosfets are secured to the gate contact pads 43.1 43.4. The gates of the P-channel mosfets are secured to the gate pads 43.2 and 43.3. Step 73 is similar to step 71. Soft solder 83 is applied to the exposed drain surfaces of the mosfets. Then in step 74 the other (drain) lead frame 30 is applied to contact the drains. The drain frame 30 is temporarily held on the drains of the mosfets by a conductive adhesive while the solder is reflowed to secure the drains to the frame 30. As a result, the process provides a dual sided leadframe assembly. That assembly along with other assemblies is placed in a cavity of a molding machine. Molten electrically insulating resin is transferred under high pressure to fill the cavity mold and encapsulate the dual lead frame assembly. See step 75. The mold cavity, not shown, is formed to have recesses for receiving and/or sealing the mold cavity off from at least a portion of the surfaces of the heat sinks. As such, the finished module 100 has exposed portion of the source and drain heat sinks. The molded assemblies are then separated by singulation from each other to provide individual modules 100, each containing four mosfets.

One of the features of module 100 is that it has no need for wire bonding. Instead, all of the connections between the leadless contacts and the devices are made using two lead frames. The resulting package conforms to existing industry standards for size and pin out of molded leadless packages. The mosfets are fully included inside the molded material and no portion of any silicon dice is exposed. The module 100 has superior thermal performance due to exposed heat sinks and drain contacts on the top and bottom of the package, respectively. Further, the design places the external leadless gate contacts at the ends of opposite outside edges of the package. Thus, the gates are in the corners of the package, which is a desired location for assembly of the module 100 on a printed circuit board.

Figure 20:
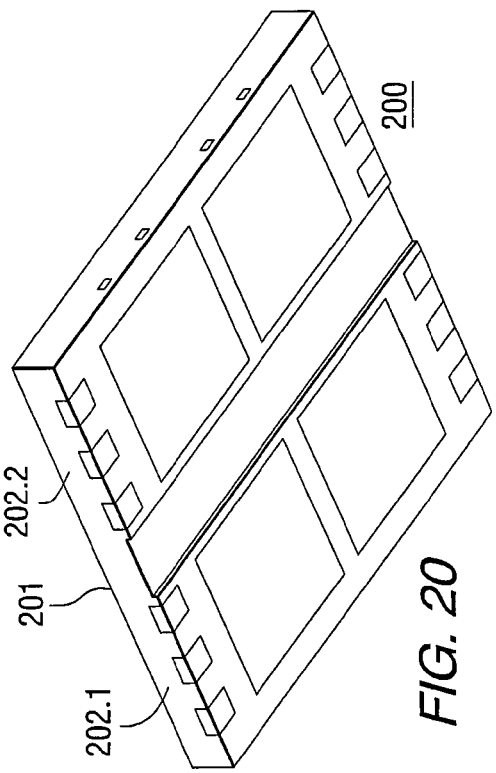
Figure 23:
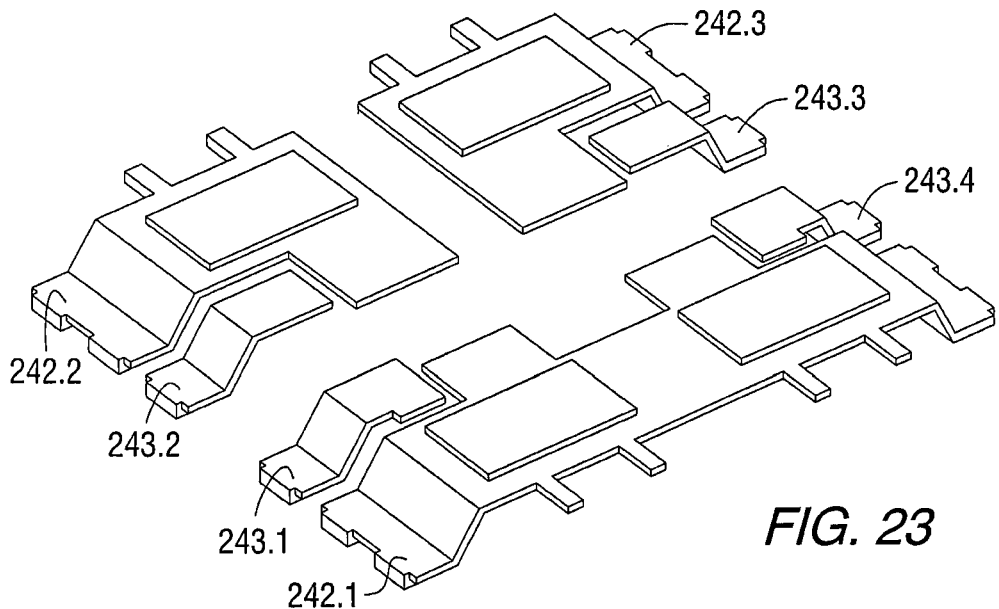
FIGS. 23 and 24 show top and bottom views of the source-gate lead frame for the second example.
Figure 24:
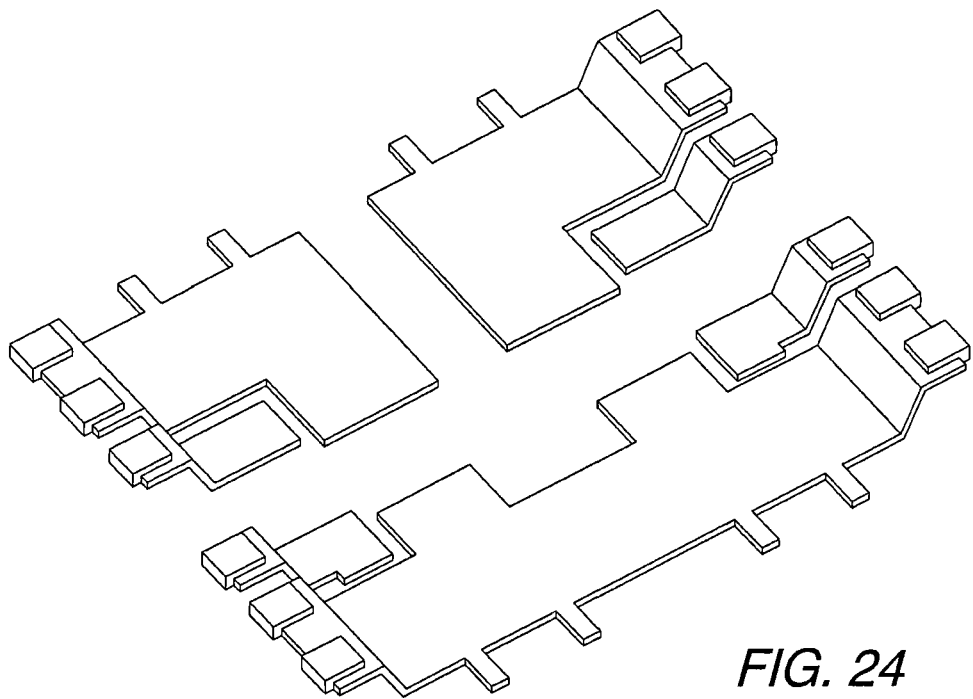
Figure 25:
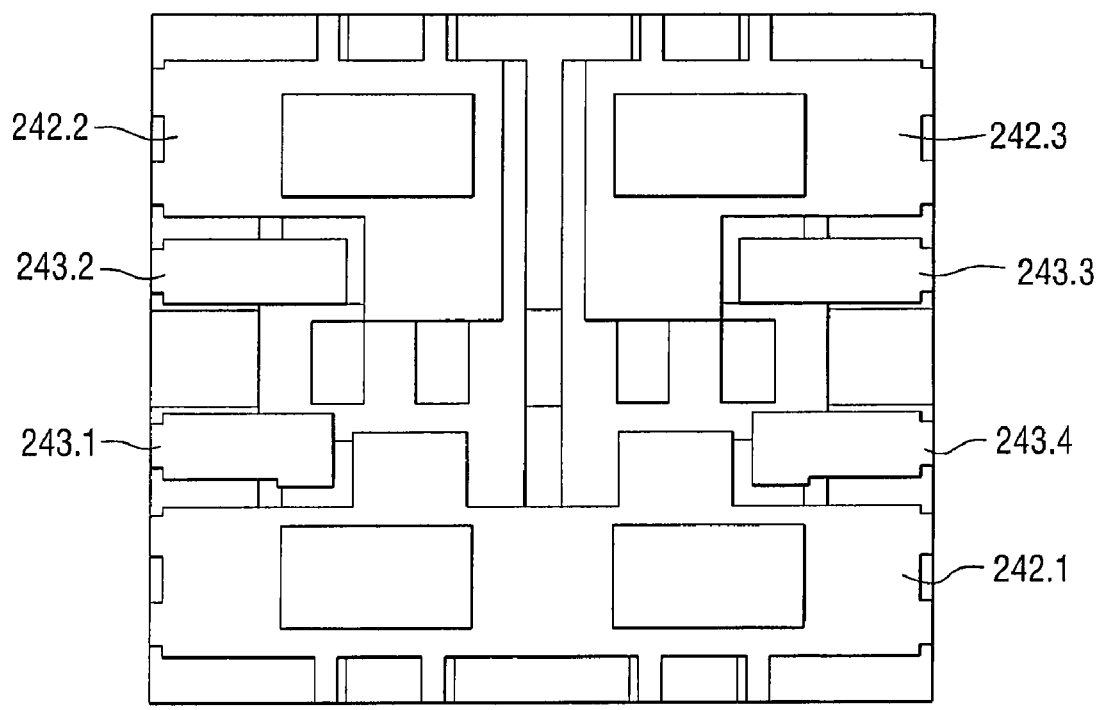
FIG. 25 shows an assembly of the MOSFETs and the leadframes for the second example.
Figure 26:
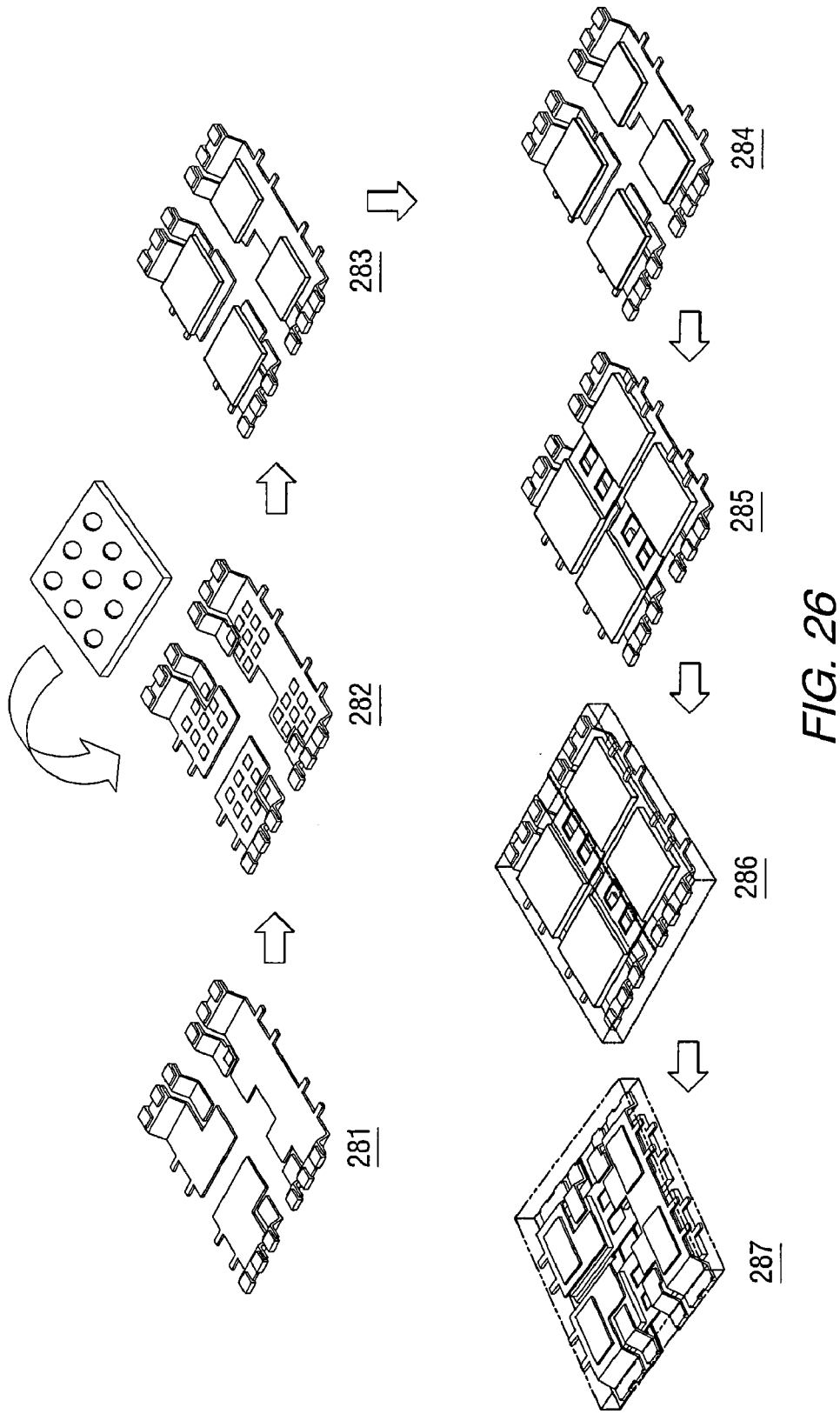
FIG. 26 shows a process for assembling and encapsulating four MOSFETs into a package of the second example.
Figure 29:
FIGS. 27-30 show a third example of a four MOSFET package.
Figure 30:
Figure 27:
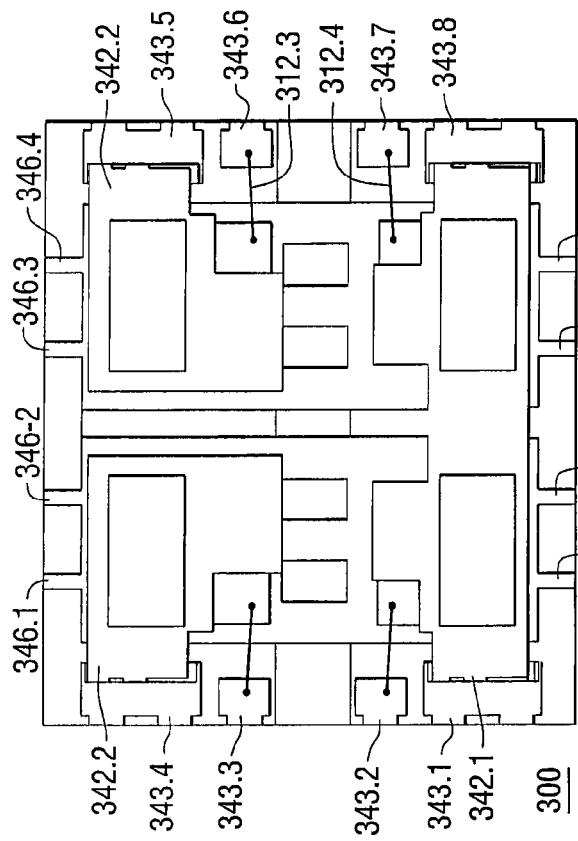
Figure 28:
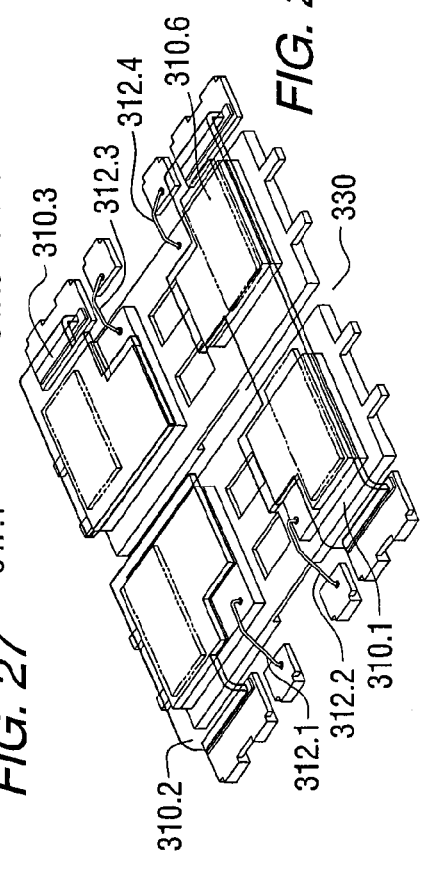
Figure 33:
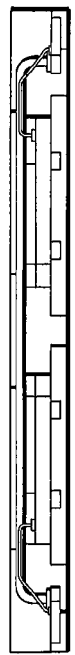
FIGS. 31-34 show an alternate version of a four MOSFET package shown in FIGS. 28-30.
Figure 34:
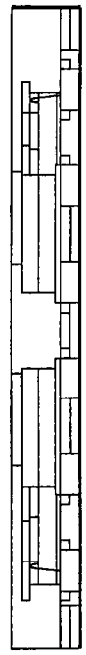
Figure 32:
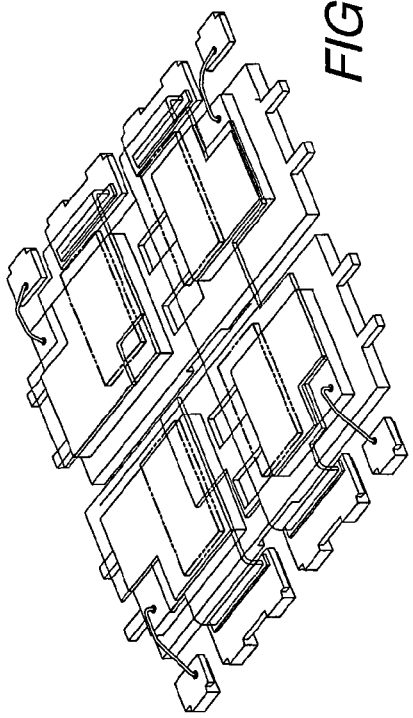
Figure 31:
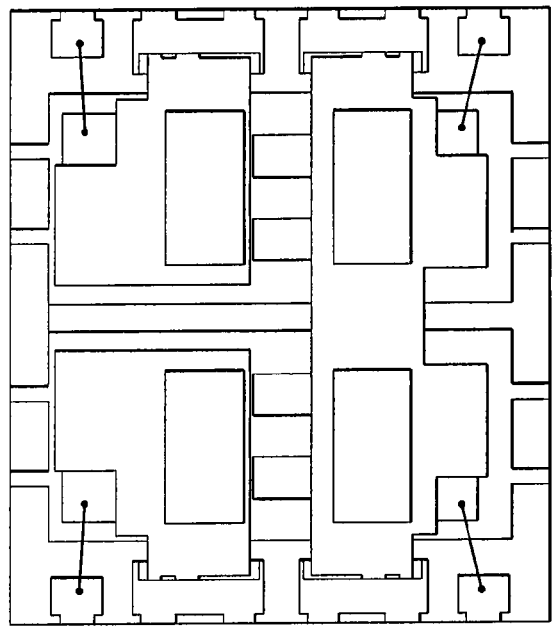

A second multichip module 200 is shown in FIGS. 19-26. In that example, only the differences between the modules 100 and 200 are illustrated. The process of manufacture is the same. The module 200 reverses the relative positions of the source and gate members. See FIGS. 23 and 24. The gate pads 243.1 and 243.2 are opposite each other on one side of the device and the gate pads 241.3 and 241.4 are opposite each other on the opposite side of the device. See FIG. 25. As such the external gate leadless contacts are proximate the middle of the package. The package is molded to have an external slot 201 between the gate leadless contacts. See FIG. 22. The slot provides a space on the printed circuit board for running gate traces to the leadless gate contacts. See FIGS. 20 and 22. The other characteristics of the module 200 are essentially the same a module 100. Module 200 has an array of four heat sinks connected to the source (FIG. 21) and another array of exposed drains (FIG. 20). The drain lead frame 50 is the same in both examples. See FIG. 26. Module 200 also has no wire bonding.

A third example of a module 300 is shown in FIGS. 27-30. There the drain leadframes 330 have all of the elements of the leadframe 30 of the prior examples. In addition, leadless contact pads 343.1-343.8 are also incorporated into the leadframe matrix 50. Tie bars (not shown) hold the contact pads during assembly of the mosfets on the frame 30 and in the mold cavity. The contact pads 343.2, 343.3, 343.6 and 343.7 are gate contact pads. They are connected to the gates of the mosfets by bond wires 312.1-312.4. The wire bonding process is conventional. The mosfets are attached to the die attach pads of one the drain leadframe 30 by soft solder, adhesive and then solder reflow. The mosfets 10, 12, 14, 16 are assembled onto the frame 340 by applying conductive tape 310.1, 310.2, 310.3 to the sources and then source clips 342.1, 342.2 and 342.3 are attached to the tape. Then apply heat to cure the conductive tape and generate a good adhesive bond between the clips and the dice. The depending ends of the source clips contact the leadless source contacts 343.1, 343.4, 343.5, 343.6. An advantage of module 300 is that the gate leadless contacts are adjacent the slot 301. The conductive tape method does not have the flux problem as in a solder paste and using conductive tape can increase the reliability of the product.

A fourth example 400 of the four mosfet module 400 is shown in FIGS. 31-34. The fourth module 400 is similar to module 300 except that the source and gate leadless contacts are reversed in the respective positions. An advantage of module 400 is that the gate leadless contacts are disposed in the corners of the device at the ends of the arrays of the source-gate contact pads.

Figure 35:
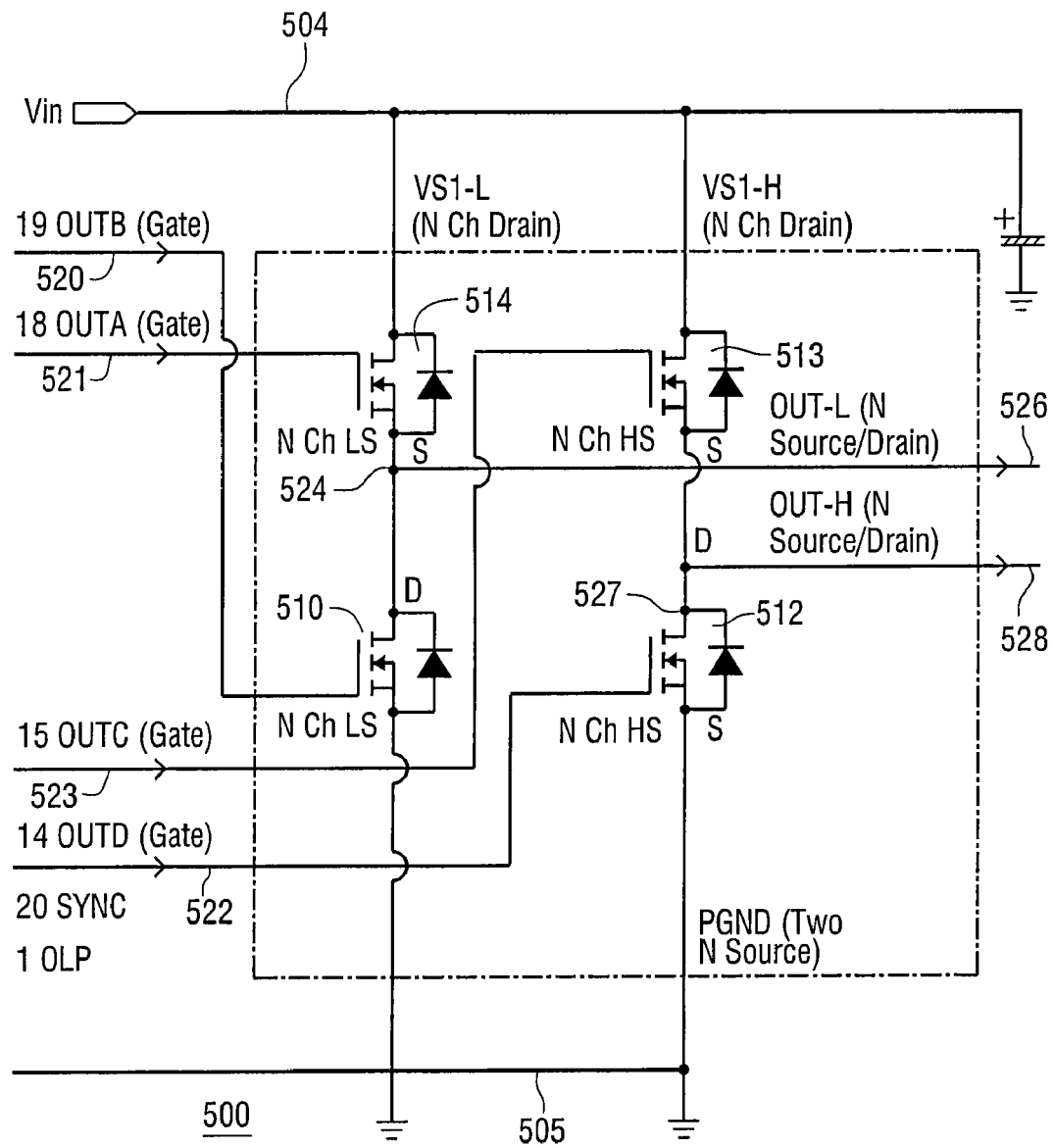
FIG. 35 shows a circuit schematic of a four N-channel MOSFET package.
Figure 36:
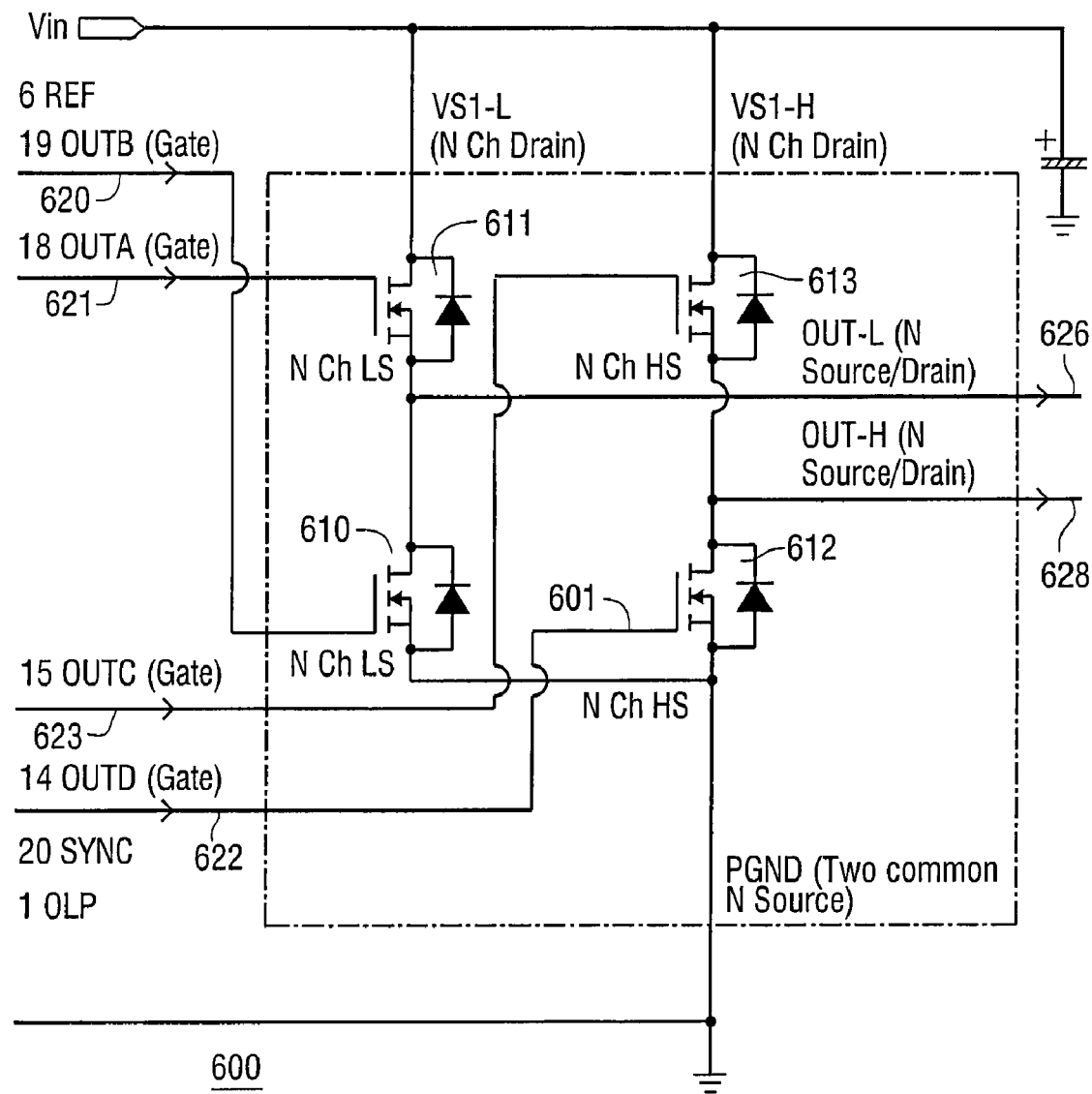
FIG. 36 shows a circuit schematic of a four N-channel MOSFET package with internally connected common drains.

A fifth example 500 of a four mosfet module is shown in FIGS. 35 and 37-43. Turning to FIG. 35, there is shown a full bridge circuit with four N-channel mosfets 510-512. Mosfets 510,511 form the low side of the bridge and mosfets 512,513 form the high side of the bridge. The drains of mosfets 511, 513 are connected to a power supply 514 and the sources of mosfets 510, 512 are separately connected to ground. The sources of mosfets 511, 513 are connected, respectively, to the drains of mosfets 510, 512. Input gate signal lines 520-522 carry gate control signals to the mosfets 510-513, respectively. Outputs line 526 carries the output of the low side source-drain node 524 and output line 528 carries the output of high side source drain node 527. FIG. 36 shows a module 600 where the sources of mosfets 610,612 are internally connected.

Figure 37:
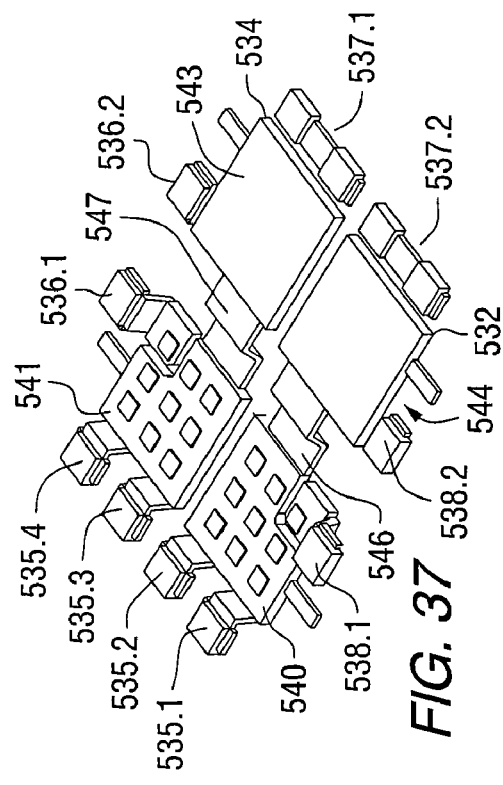
FIGS. 37 and 38 show perspective views of a bi-level four MOSFET lead frame and an assembled four MOSFET package.
Figure 38:
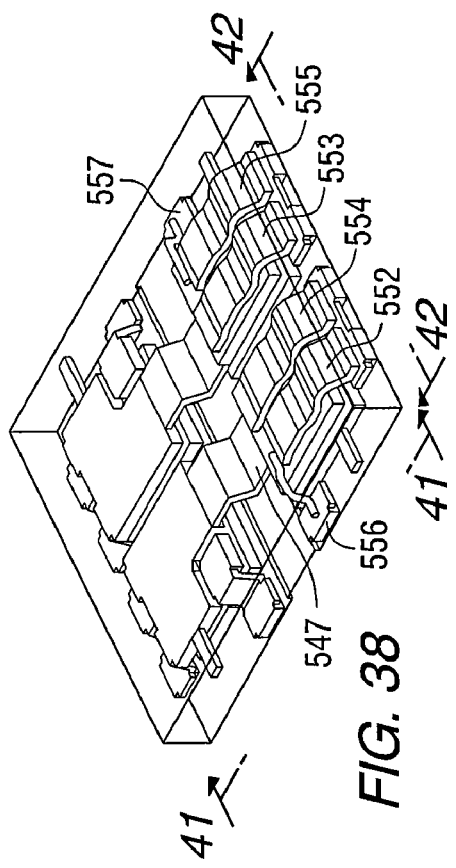
Figure 41:
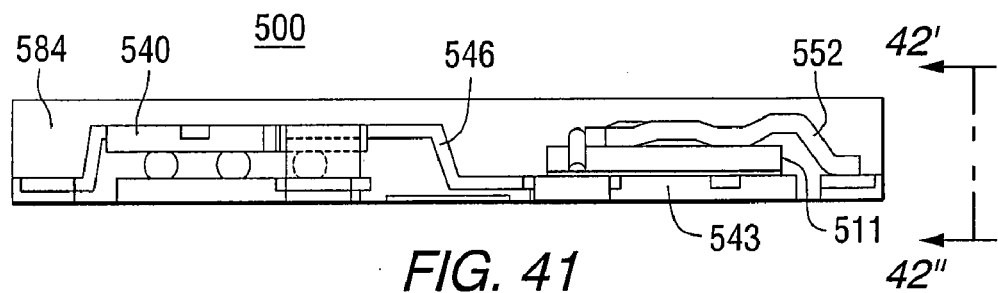
FIGS. 41-43 show further details of a four N-channel MOSFET package.
Figure 42:
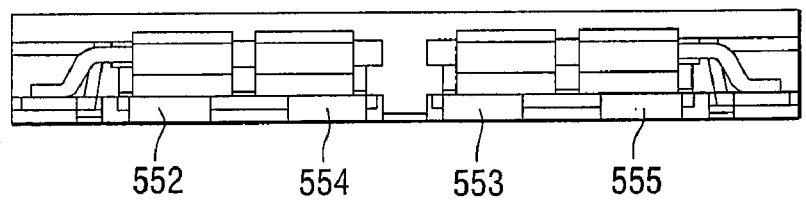
Figure 43:
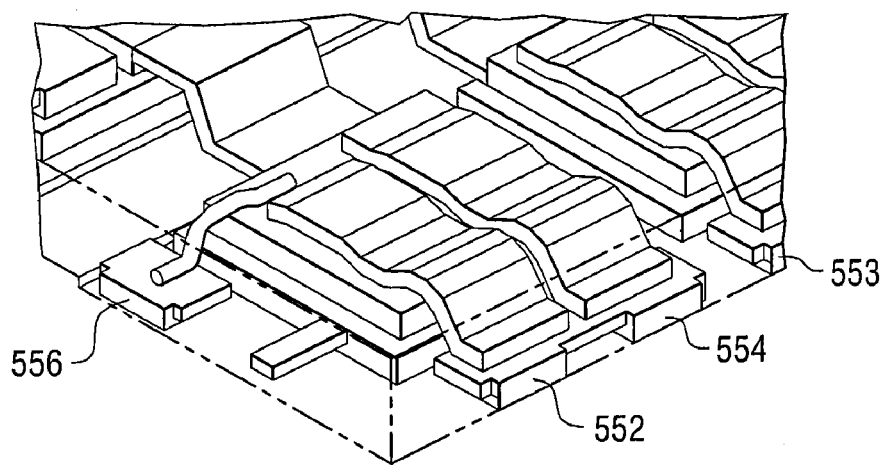

In module 500, the full bridge is made using all N-channel mosfets. The bridge is constructed by using a leadframe whose body connects the source of one mosfet in half the bridge to the drain of the other mosfet in the half of the bridge. Turning to FIGS. 37, 38, there is shown the two-level lead frames 532, 534. Each is the mirror image of the other. Lead frame 534 has a first die attach pad 541 disposed in one plane, a second die attached pad 543 disposed in a second, parallel plane, and an intermediate member 547 that connects the two die attach pads. See FIG. 41. The source of one mosfet 511 will be attached to one die attach pad 541 and the drain of the mosfet 510 will be attached to the other die attach pad 543. Leadless gate contacts 536.1, 536.2 are configured to also have two planar members and intermediate connecting member to connect the external leadless contact to internal contact pads that attach to the gates of the mosfets 510, 511. Likewise, the source of mosfet 513 will be attached to one die attach pad 540 and the drain of the mosfet 512 will be attached to the other die attach pad 544. Leadless gate contacts 538.1, 538.2 are configured to also have two planar members and intermediate connecting member to connect the external leadless contact to internal contact pads that attach to the gates of the mosfets 512, 513.

The drains of mosfets 511, 513 are electrically and mechanically attached to die attach pads 543, 544. Those skilled in the art will appreciate that the source-drain connections are made entirely inside the package. In addition, the source-drain connections are made without bond wires, as is typical of conventional packages. Instead, the source drain connections are made using the bodies of the lead frames for connecting the source and drain of each half of the bridge to provide the output connections 526,528. This features reduces the complexity of assembly and save conventional wire bonding steps. Leadless source contacts 537.1, 537.2 receive ribbon bonds 552-555 to connect the sources to the ground. Gates of mosfets 511, 513 are connected to leadless contact pads by wire bonds 556, 557.

Figure 39:
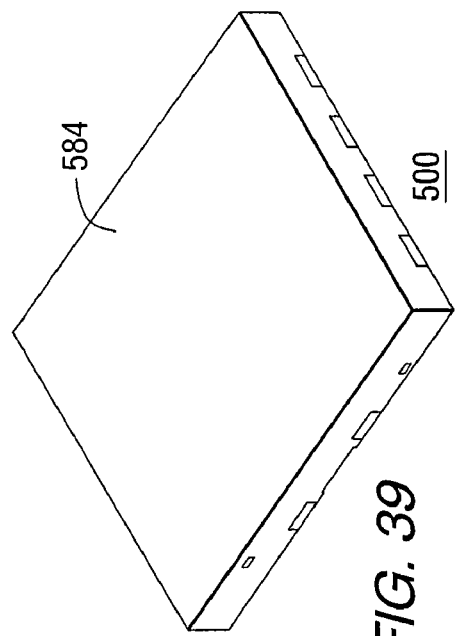
FIGS. 39 and 40 show external views of the four N-channel MOSFET package of FIGS. 37 and 38.
Figure 40:
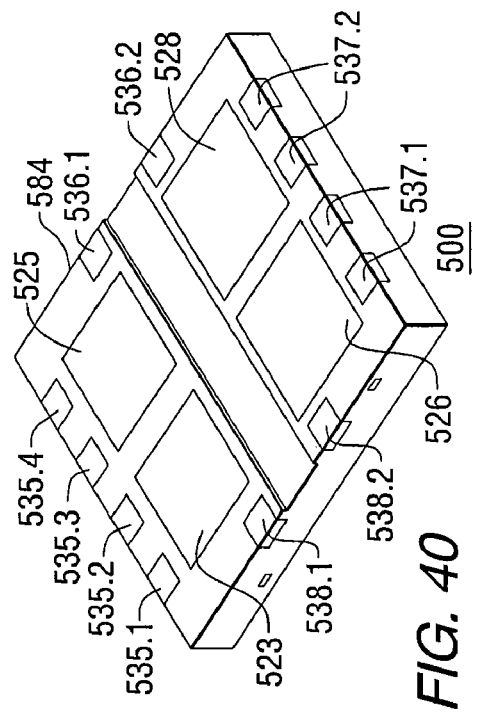

Turning to FIGS. 39, 40 there is shown the outside top and bottom appearance of the module 500. The module 500 has a center slot and with four gate pads, two gate pads at each end of the slot and spaced apart from each other by the slot. The two level lead frame and the leadless contacts and dies are encapsulated in an electrically insulating molding compound 584. Portions of the die attach pads are exposed on the bottom surface of the molded package to help transfer heat from the module 500 to the ambient environment. Exposed low side drain of mosfet 511 and exposed high side drain of mosfet 513 will be connected to the power supply 504, which is typically a circuit trace on a print circuit board. Leadless contacts 535.1-535.4 and bottom contact pads 526, 528 connect to the internal nodes 524, 527 that correspond to the low side source/drain and high side source/drain connections. The source contacts 537.1 and 537.2 provide the connections to the ground.

Figure 44:
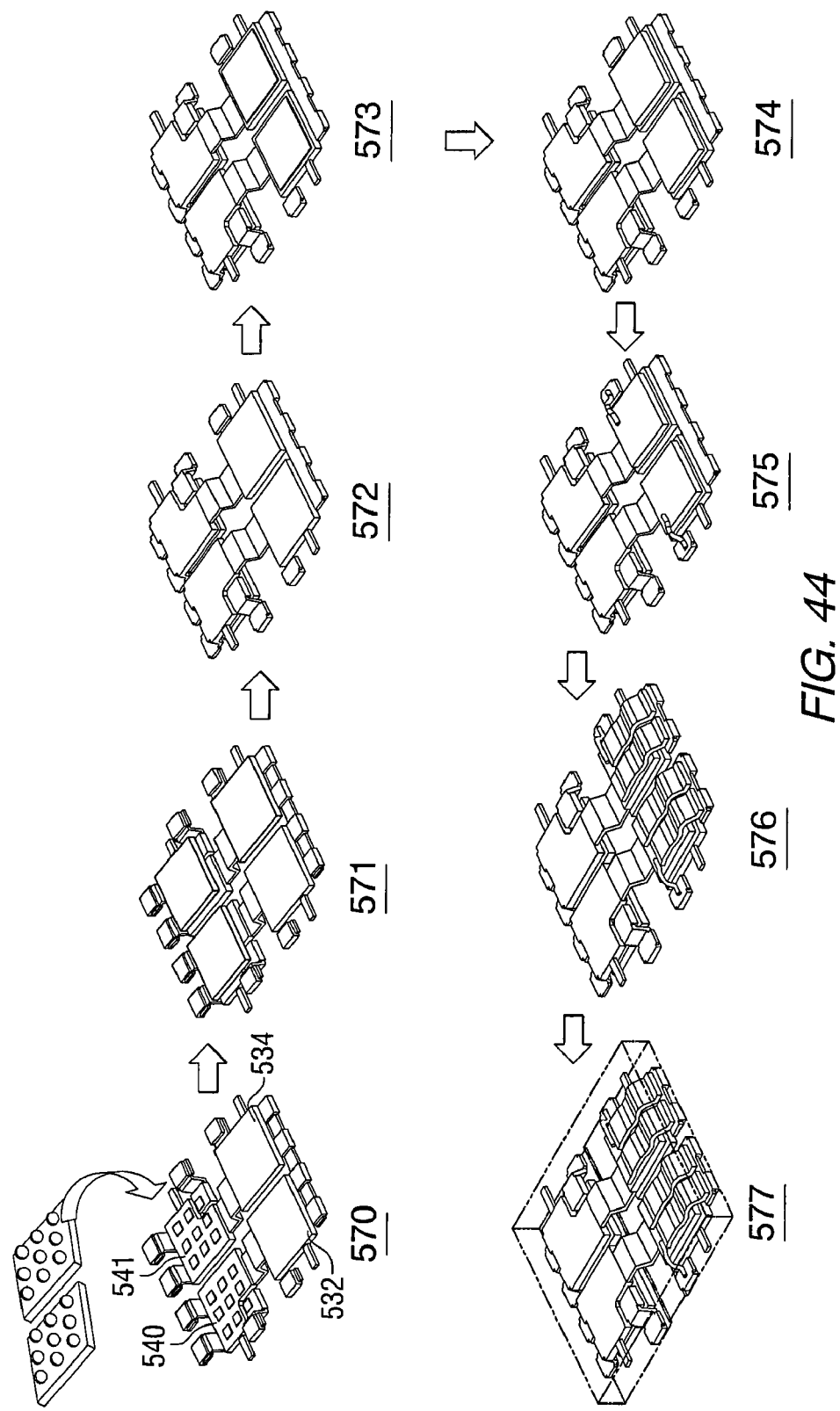
FIG. 44 shows the steps in assembling the fifth example of a four N-channel MOSFET package.

Key steps of the assembly and molding process are shown in FIG. 44. In a first step 570 solder paste is printed on upturned surfaces 540, 541 of lead frame members 532, 534. Two mosfets with ball grid array contacts on their sources and gates are flip chip attached to the upturned surfaces. In step 571 the solder is reflowed to attach the mosfets. In step 572 the lead frame members are turned over and soft solder is applied to the upturned surfaces of the lead frames (step 573). Two other mosfets with their drains are attached (step 574) to the soft solder and it is reflowed to fix the mosfets on the lead frames. The four gates are wire bonded to the gate leadless contact pads (step 575). In step 576 the sources of the mosfets are ribbon bonded to the leadless source contact pads. In a final step 576 the assembly is placed in a cavity mold and molten insulating resin is transferred into the cavity to enclose the assembly in an electrically insulating compound.

Figure 45:
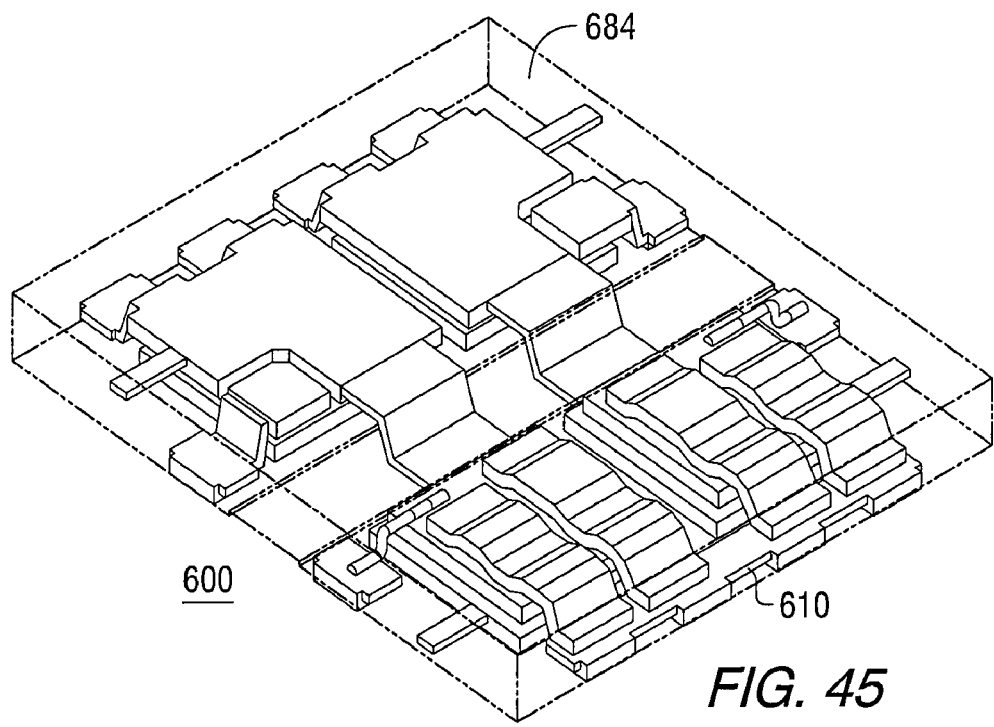
FIGS. 45 and 46 show perspective drawings of a sixth example of a four N-channel MOSFET package.
Figure 46:
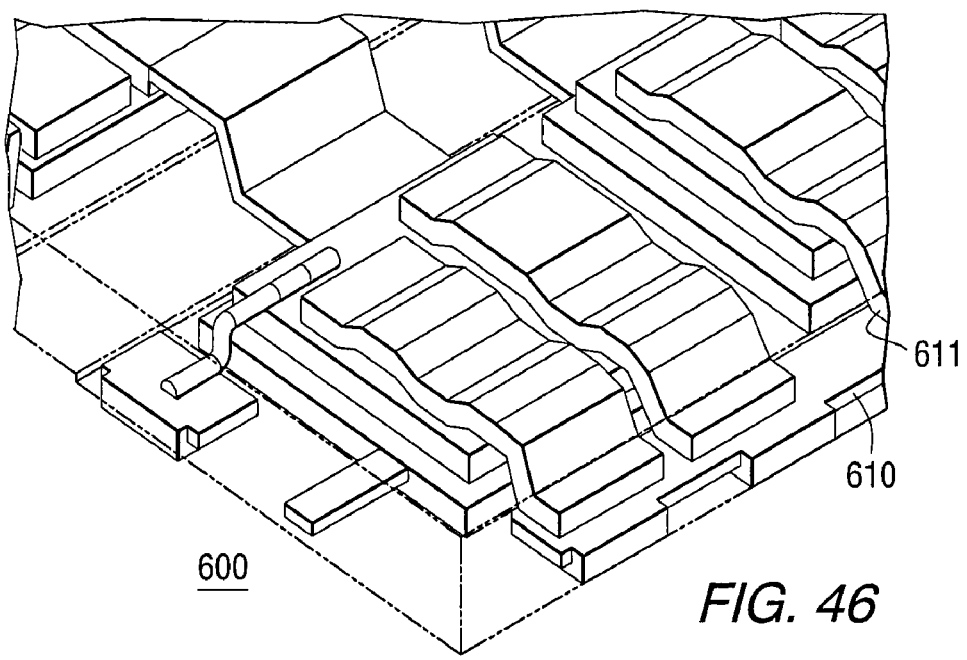
Figure 48:
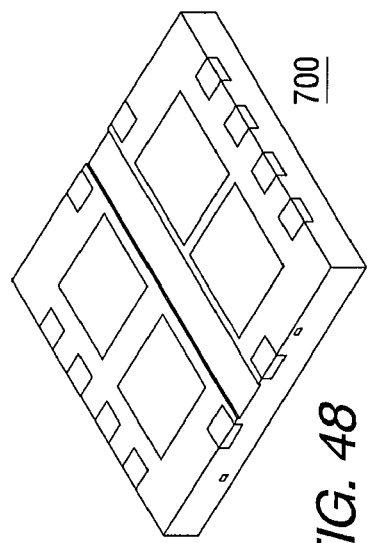
FIGS. 47-50 show internal perspective and external perspective views of a seventh example of a four N-channel MOSFET package.
Figure 50:
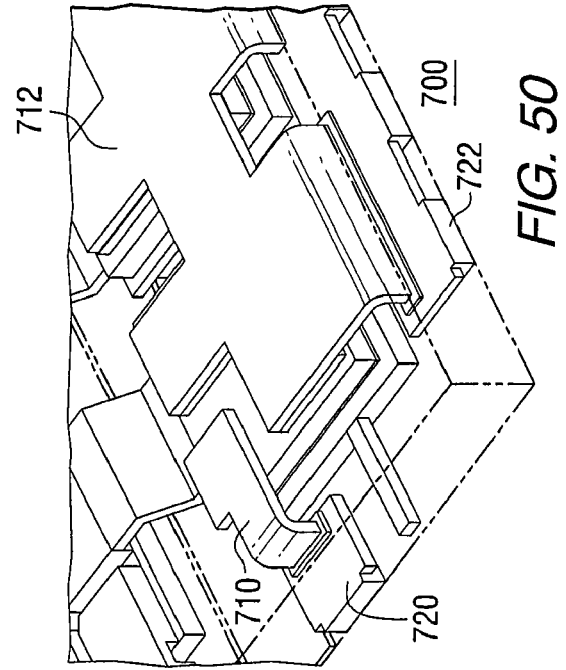
Figure 47:
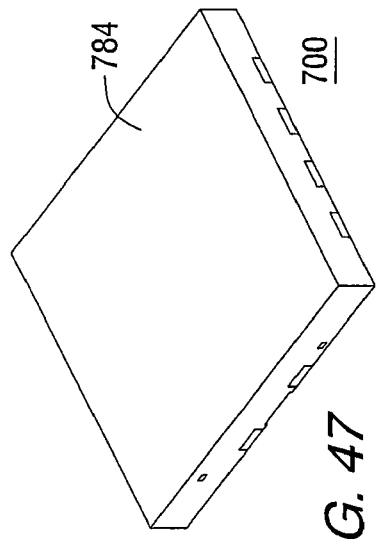
Figure 49:
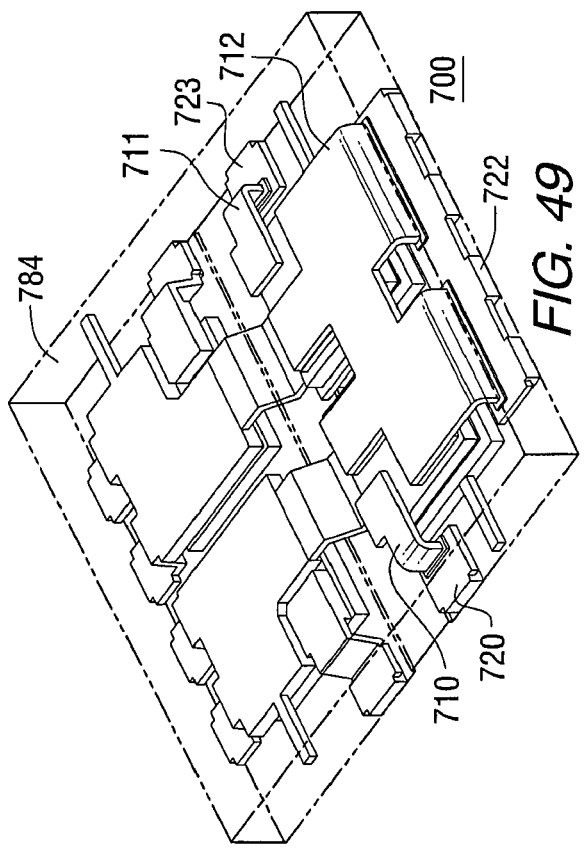

A sixth example 600 of the four mosfet module is shown in FIGS. 45, 46. Many customer desire the sources be interconnected inside the package. This version of the four mosfet device meets the customer requirements by using a leadless contact bar 610. The bar has four external leadless contact pads and the tops of the pads are integral with a common metal strip 611.

A seventh example 700 of the four mosfet module is shown in FIGS. 47-50. As in the prior examples, two mosfets are flip chip die attached to one surface of the double lead frames. The other die attach pad receive solder paste, have the drains of the third and fourth mosfets attached to the die pads, and solder is reflowed to fix the die on the pad. Then a conductive epoxy is applied to the source and gate regions. A source clip 712 connects the sources to a source bar 722. Gate clips 710, 711 connect the gate to leadless gate contact pads.

Those skilled in the art understand that the one or more features of the above examples may be combined together to comprise further combinations of lead frames, clips, wire bonding and ribbon bonding.

The invention claimed is:

1. A process for encapsulating multiple dies in an electrically insulating compound comprising:
    providing four mosfets, each mosfet having a source, gate and drain contacts and arranged as first and second pairs of mosfets;
    directly connecting one source clip to the source contacts of two of the mosfets, directly connecting a second source clip to a source contact of a third mosfet and directly connecting a third source clip to a source contact of a fourth mosfet;
    directly connecting each one of four gate clips to one of the four gate contacts of the four mosfets, respectively;
    directly connecting each one of two drain clips to one of each of the pairs of mosfets, respectively;
    attaching leadless contacts to the source contacts, gate contacts and drain contacts;
    disposing the leadless contacts in a common plane; and
    encapsulating the mosfets in an electrically insulating compound to form a four-sided package having four edges with two sets of edges opposite each other and to expose the drain clips and the leadless contacts.

2. The process of claim 1 comprising the further step of arranging the mosfets in a two by two array.

3. The process of claim 1 comprising the further step of arranging the leadless contacts for the gates and the sources in first and second linear arrays on two opposite edges of the module.

4. The process of claim 3 comprising the further step of arranging the gate contacts at the ends of the respective arrays.

5. The process of claim 3 comprising the further step of arranging the gate contacts proximate the centers of the respective arrays.

6. The process of claim 1 wherein the mosfets comprise two n-channel mosfets and two p-channel mosfets.

7. The method of claim 6 wherein the p-channel drains are connected to one drain clip and the n-channel drains are connected to the other drain clip.

8. The method of claim 7 wherein the source clip connected to two mosfets is directly connected to the source contacts of the n-channel mosfets.

* * * * *